United States Patent [19]

Lorenz

[11] Patent Number: 5,539,242

[45] Date of Patent: Jul. 23, 1996

[54] FULLY CURRENT-BALANCED BIPOLAR POWER TRANSISTOR FOR INTEGRATED CIRCUIT APPLICATIONS

[75] Inventor: Perry S. Lorenz, Sunnyvale, Calif.

[73] Assignee: National Semiconductor Corporation, Santa Clara, Calif.

[21] Appl. No.: 285,406

[22] Filed: Aug. 3, 1994

[51] Int. Cl.$^6$ .................. H01L 27/082; H01L 27/102; H01L 29/70
[52] U.S. Cl. .................. 257/578; 257/579; 257/587
[58] Field of Search .................. 257/578, 579, 257/580, 582, 583, 773, 775, 587

*Primary Examiner*—Wael M. Fahmy
*Attorney, Agent, or Firm*—Limbach & Limbach

[57] ABSTRACT

An integrated circuit power transistor, comprising an elongate, resistive, base region and an elongate emitter region formed in part of the base region to provide a base-emitter junction. The power transistor also includes a strip-like base connection formed in part of the base region. The base connection extends from a base terminal towards a remote end, and includes a junction-facing edge facing the base-emitter junction. The junction-facing edge is spaced from the base-emitter junction by a distance that decreases towards the remote end of the base connection. This sets the base side of the base-emitter junction to substantially the same voltage at all points along the length of the base-emitter junction despite an ohmic voltage drop in the base connection that increases towards the remote end of the base connection.

20 Claims, 4 Drawing Sheets

FULLY CURRENT-BALANCED BIPOLAR POWER TRANSISTOR FOR INTEGRATED CIRCUIT APPLICATIONS

FIELD OF THE INVENTION

The invention relates to transistor structures for use in integrated circuits, and, in particular, to bipolar power transistor structures.

BACKGROUND OF THE INVENTION

Bipolar power transistors used in integrated circuits conventionally have an elongate structure. An elongate structure minimizes the area of the integrated circuit required for a transistor having a given current handling capability. The structure of a typical bipolar power transistor 10 is shown in FIG. 1. A primary consequence of the elongate structure is that the collector region 11, the collector metal 12, the emitter region 13, the emitter metal 14, the base region 15, the base metal 16, and the base-emitter junction 18 between the base region and the emitter region are also elongate. Additionally, the base-emitter junction is serrated to increase the junction length within the overall dimensions of the transistor.

The emitter metal 14 connects the emitter region 13 of the transistor to a hypothetical emitter terminal 20, and thence to other elements (not shown) of the integrated circuit. In the example shown, the emitter metal 14 is a strip of metal deposited on the surface of the emitter region and extending from the emitter region to other pans (not shown) of the integrated circuit.

The emitter metal 14 has an appreciable resistance along its length between the emitter terminal 20 and its remote end 22, remote from the emitter terminal. As a result of this resistance, the voltage VEA applied to the emitter region 13, and, hence, to the emitter side 17 of the base-emitter junction 18 differs from the voltage VET at the emitter terminal. This voltage difference progressively increases along the length of the emitter metal 14 towards the remote end 22. With the emitter current IE flowing in the direction shown in FIG. 1, the voltage applied to the emitter side 17 of the base-emitter junction progressively increases from a minimum VEP at the end of the emitter region adjacent the emitter terminal 20 to a maximum VER at the end of the emitter region adjacent the remote end 22 of the emitter metal.

The current through the base-emitter junction 18 depends on the base-emitter voltage VBE according to $\exp(qVBE/kT)$, where q is the electronic charge, VBE is the voltage between the base side 19 and the emitter side 17 of the base-emitter junction 18, k is Boltzman's constant, and T is the temperature in degrees K. Hence, the variation in the voltage applied to the emitter region 13 by the emitter metal 14 at different points along the length of the base-emitter junction causes the current through the base-emitter junction to vary significantly from one end of the base-emitter junction to the other.

For example, at an emitter current IE of 500 mA, the measured difference between the voltage at the emitter terminal VET and the voltage VER at the remote end 22 of the emitter metal was 326 mV. As a result of the corresponding difference in the voltage at the emitter side 17 of the base-emitter junction, the emitter current IER at the end of the emitter region adjacent the remote end 22 of the emitter metal was less than one one-millionth of the emitter current IEP at the end of the emitter region adjacent the emitter terminal 20. This imbalance in the emitter current resulting from the change in the voltage at the emitter side of the base-emitter junction due to the ohmic drop in the emitter metal 14 requires that the transistor be made larger than would otherwise be required to provide a given current handling capacity.

U.S. Pat. No. 4,072,979 discloses the structure shown in FIG. 2. This structure provides a substantially uniform voltage at the emitter side 37 of the base-emitter junction 38 along the length of the base-emitter junction. In the structure shown in FIG. 2, the emitter region 32 is divided into a junction zone 41, and plural contact zones 43 and plural interconnecting zones 45 arrayed along the length of the base-emitter junction 38. Each interconnecting zone 45 connects one contact zone 43 to part of the junction zone 41. The emitter metal 34 runs along the length of the emitter region 32 and contacts each contact zone 43.

Between each pair of adjacent interconnecting zones 45 is a low conductivity zone 47. The low-conductivity zone is a zone of intrinsic material, or base region material. The conductivity of the low-conductivity zone is substantially less titan that of the emitter region, so that the emitter current flows from each contact zone 43 to the junction zone 41 via the respective interconnecting zone 45. The interconnecting zones each have a resistance determined by their widths W, which differ along the length of the emitter region 32.

The resistance of each interconnecting zone 45 introduces an additional voltage difference between the emitter metal 34 and the part of the junction zone 41 adjacent the interconnecting zone. The total difference between the voltage VET at the hypothetical emitter terminal 40 and the voltage at the emitter side 37 of the base-emitter junction adjacent each interconnecting zone 45 is therefore the sum of the voltage drop in the emitter metal 34 between the emitter terminal 40 and the respective contact zone 43 and the voltage drop due to the resistance of the interconnecting zone.

To distribute the voltage at the emitter side 37 of the base-emitter junction 38 evenly along the length of the base-emitter junction, and, hence, to distribute the emitter current evenly, the width W of each interconnecting zone 45 is designed to provide a resistance that causes the voltage drop across the interconnecting zone to be such that the total voltage drop between the emitter terminal 40 and the part of the emitter side 37 of the base-emitter junction adjacent the interconnecting zone is the same for all the interconnecting zones. The width WP of an interconnecting zone 45 closer to the emitter terminal 40 is made less (giving a higher resistance) than the width WR of an interconnecting zone more remote from the emitter terminal. In this way, the voltage at the emitter side 37 of the base-emitter junction 38 is made the same along the: entire length of the base-emitter junction. This provides a significant improvement in the evenness of the distribution of the emitter current along the length of the base-emitter junction.

Providing the same voltage at the emitter side 17 of the base-emitter junction 18 at all points along the length of the base-emitter junction shown in FIG. 1 does not result in an entirely uniform emitter current distribution, however. This is because there is a secondary effect, namely, the ohmic loss of base voltage along the length of the base metal 16 caused the flow of the base current through the base metal. This causes the voltage applied to the base side 19 of the base-emitter junction to change along the length of the bate-emitter junction.

The base connection 56 connects the base region 15 of the transistor to the hypothetical base terminal 50, and thence to other elements (not shown) of the integrated circuit. In the example shown, the base connection 56 includes the base metal 16 deposited on the surface of the base plug 54 formed in the base region 15. The base plug is a highly-doped region of the same conductivity as the base region. For example, in an npn transistor, the base plug is a p+ region. In known power transistors, the base plug 54 is elongate and runs parallel to the base-emitter junction 18.

The base metal 16 has an appreciable resistance along its length between the base terminal 50 and the remote end 52 of the base metal. As a result of this resistance, the voltage VBA applied to the base region, and hence to the base side 19 of the base-emitter junction 18, differs from the voltage VBT applied to the base terminal 50. Due to the flow of the base current though the base metal, the difference between the voltage VBT at the base terminal 50 and the voltage VBA applied to the base region 15 increases along the length of the base metal towards the remote end 52. With the base current IB flowing in the base metal in the direction shown in FIG. 1, the voltage applied to the base side 19 of the base-emitter junction progressively decreases from a maximum VBP at the end of the base region adjacent the base terminal 50 to a minimum VBR at the end of the base region adjacent the remote end 52 of the base metal.

If the emitter structure shown in FIG. 2 is used to make the voltage at the emitter side 17 of the base-emitter junction 18 the same at all points along the length of the base-emitter junction, the above-described variation in the voltage at the base side 19 of the base-emitter junction 18 along the length of the base-emitter junction will reduce the emitter current carried by the part of the emitter region 12 remote from the base terminal 50. The same law of current flow discussed above applies. For example, with a base current of 50 mA, a voltage difference of 79 mV was measured on the base metal between the base terminal 50 and the remote end 52. As a result of the corresponding difference in voltage between the opposite ends of the base side 19 of the base-emitter junction 18, the emitter current carried by the pan of the emitter region 13 remote from the base terminal 50 is less than one-tenth of that carried by the pan of the emitter region adjacent the base terminal.

To mitigate the effects of ohmic loss in the base metal on current distribution, it is known to use a very wide base metal to minimize the ohmic loss in the base metal. It is also known to provide a wide region of base material between the base metal and the base-emitter junction. The voltage drop due to the resistance of the wide region of base material effectively swamps the change in voltage between the opposite ends of the base metal 16. Both of these solutions, however, have the effect of increasing the area required to provide a transistor having a given current handling capability.

Another way of providing a more even current distribution in an integrated circuit power transistor is to use a power transistor with a radial structure. In a radial structure, the base-emitter junction is centered on the emitter terminal. This structure makes the path length between the emitter terminal and all points on the emitter side of the base-emitter junction the same. This structure, however, requires two metallization layers because the base terminal must overlay the emitter terminal to enable all points on the base side of the base-emitter junction also to be equidistant from the base terminal. To balance the current distribution in the transistor in this manner requires more complicated processing because of the second metallization layer, and results in a structure that uses the available area of the integrated circuit less efficiently.

OBJECTS AND SUMMARY OF THE INVENTION

It is an object of the invention to provide a power transistor in which the emitter current is evenly distributed along the length of the base-emitter junction independently of the emitter current and current gain of the transistor. Accordingly, the invention provides an integrated circuit power transistor comprising an elongate, resistive, base region and an elongate emitter region formed in part of the base region to provide a base-emitter junction. The power transistor also includes a strip-like base connection formed in part of the base region. The base connection extends from a base terminal towards a remote end, and includes a junction-facing edge facing the base-emitter junction. The junction-facing edge is spaced from the base-emitter junction by a distance that decreases towards the remote end of the base connection. This sets the base side of the base-emitter junction to substantially the same voltage at all points along the length of the base-emitter junction despite art ohmic voltage drop in the base connection that increases towards the remote end of the base connection.

The base connection may include a strip-like base metal overlying part of the base region, and an elongate base plug formed in part of the base region under the base mend. The base plug includes a junction-facing edge which faces the base-emitter junction and provides the junction-facing edge of the base connection. Alternatively, the power transistor may additionally include an oxide layer overlying the base region, and the base connection may include an elongate base contact formed in the oxide layer, and a strip-like base metal overlying the base contact and part of the oxide layer. The base contact includes a junction-facing edge that faces the base-emitter junction and provides the junction-facing edge of the base connection.

The power transistor may additionally include a strip-like emitter metal formed on part of the emitter region and extending from an emitter terminal towards a remote end, and a structure that contacts the emitter metal and sets the emitter side of the base-emitter junction to substantially the same voltage at all points along the length of the base-emitter junction despite the ohmic voltage drop in the emitter metal that increases towards the remote end of the emitter :metal. This structure may include an elongate contact zone contacting the emitter metal, an elongate junction zone adjacent the base-emitter junction, and plural interconnecting zones distributed along the contact zone and connecting the contact zone to the junction zone. The interconnecting zones have, resistances that progressively decrease towards the remote end of the emitter metal.

The invention also provides an integrated circuit power transistor that comprises an elongate, resistive, base region, an elongate emitter region formed in part of the base region to provide a base-emitter junction, and a strip-like base metal formed on part of the base region, and extending from a base terminal towards a remote end. An elongate base plug is formed in the base region under the base metal, contacting the base metal. The base plug includes a junction-facing edge facing the base-emitter junction. The junction-facing edge is spaced from the base-emitter junction by a distance that decreases towards the remote end of the base metal to set the base side of the base-emitter junction to substantially the same voltage at all points along the length of the base-emitter junction despite the ohmic voltage drop in the base metal that increases towards the remote end of the base metal. The transistor additionally comprises a strip-like emitter metal formed on part of the emitter region, and extending from an emitter terminal towards a remote end. Finally, the transistor includes a structure that contacts the emitter metal and sets the emitter side of the base-emitter junction to substantially the same voltage at all points along the length of the base-emitter junction despite the ohmic voltage drop in the emitter metal that increases towards the remote end of the emitter metal.

In both of the power transistors provided by the invention, the emitter region may be shaped to provide a base-emitter junction substantially parallel to the base metal, or the junction-facing edge of the base plug may be substantially parallel to the base metal.

Finally, the invention provides a method of distributing emitter current uniformly in a power transistor having an elongate base-emitter junction between an elongate emitter region formed in an elongate base region. In the method, a strip-like base connection is formed in part of the base region. The base connection extends from a base terminal towards a remote end, and includes a junction-facing edge facing the base-emitter junction and spaced from fire base-emitter junction by a distance. At least one of the junction-facing edge and the base-emitter junction is shaped to set the distance between the junction-facing edge and the base-emitter junction at plural points on the base-emitter junction. The distance between the junction-facing edge and rise base-emitter junction at each of the plural points is set such that the voltage, drop between the base terminal and each of the plural points on the base-emitter junction is the same. The voltage drop between the base terminal and each of the plural points on the base-emitter junction is the sum of a first voltage drop and a second voltage drop. The first voltage drop is the voltage drop between the base terminal and a point on the base connection opposite the point on the base-emitter junction, and is due to the flow of base current through the base connection. The second voltage drop is the voltage drop between the point on the base connection and the point on the base-emitter junction, and is due to the flow of a segment of the base current through the base region.

In the method, a strip-like emitter metal may be formed on part of the emitter region remote from the base-emitter junction. The emitter metal extends from an emitter terminal towards a remote end, substantially parallel to the base-emitter junction. The emitter region between the emitter metal and the base-emitter junction may be shaped to provide differing resistances between the emitter metal and each of plural points on the base-emitter junction. The different resistances are provided such that the voltage drop between the emitter terminal and each of the plural points on the base-emitter junction is the same. The voltage drop between the emitter terminal and each of the plural points on the base-emitter junction is a sum of a first voltage drop and a second voltage drop. The first voltage drop is the voltage drop between the emitter terminal and a point on the emitter metal opposite the point on the base-emitter junction, and is due to the flow of the emitter current through the emitter metal. The second voltage drop is the voltage drop between the joint on the emitter metal and the point on the base-emitter junction, and is due to the flow of a segment of the emitter current through the resistance.

DETAILED DESCRIPTION OF THE INVENTION

Figure 1:
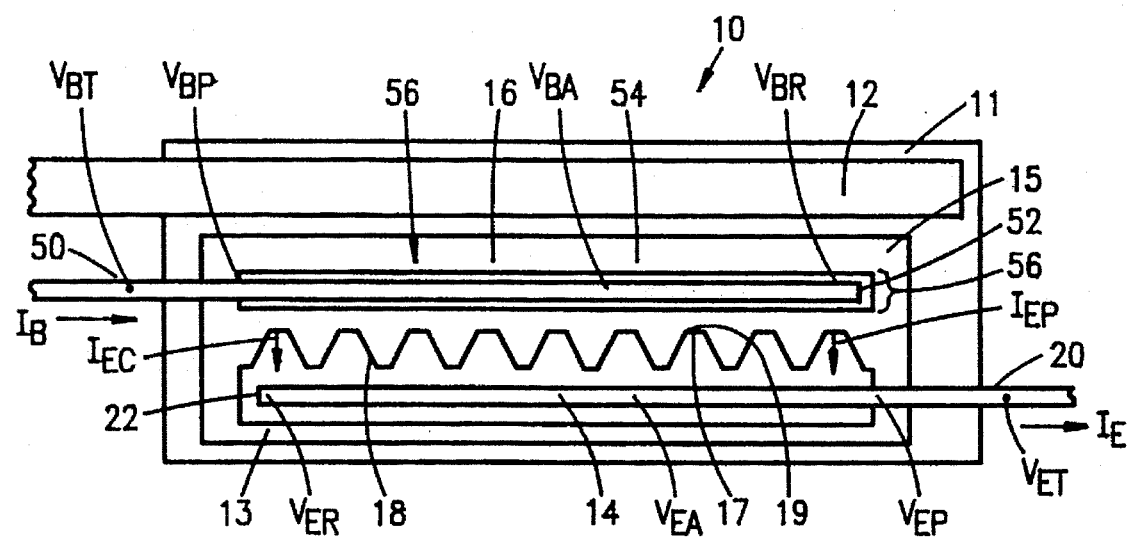
FIG. 1 shows the layout of a known integrated circuit power transistor.
Figure 2:
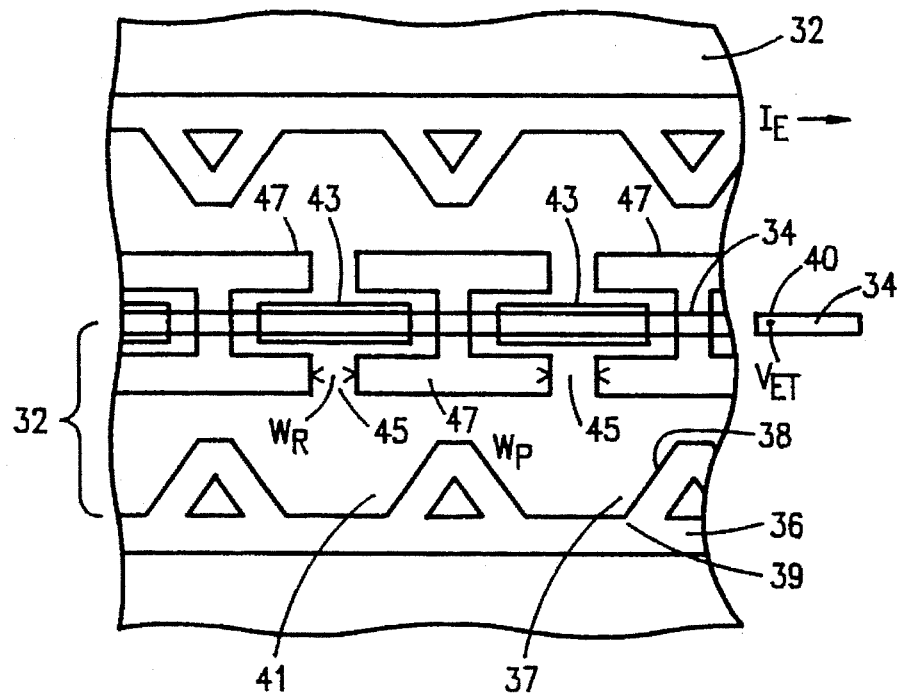
FIG. 2 shows the layout of a known integrated circuit power transistor that includes compensation for ohmic drop along the emitter metal to improve the evenness of the distribution of the emitter current along the base-emitter junction.
Figure 3A:
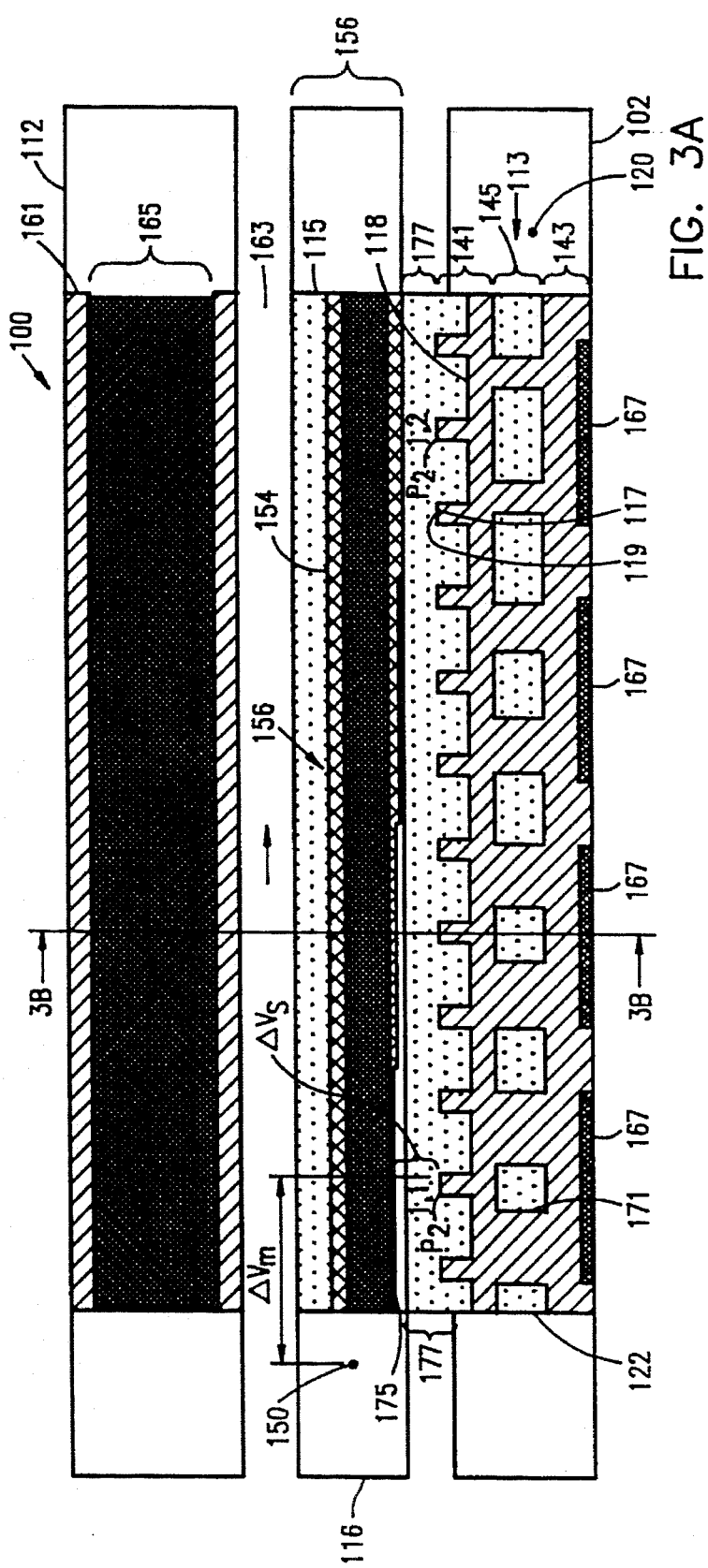
FIG. 3A shows the layout of an integrated circuit power transistor according to the invention. The transistor additionally includes compensation for ohmic drop along the base metal to provide an even distribution of the emitter current along the base-emitter junction independent of the emitter current and the current gain of the transistor.
Figure 3B:
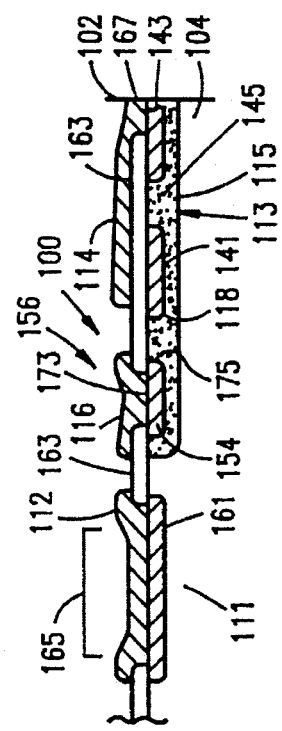
FIG. 3B is a cross-sectional view of the power transistor according to the invention shown in FIG. 3A.

The bipolar power transistor 100 for integrated circuit use according to the invention is shown in FIGS. 3A and 3B. In the power transistor according to the invention, the junction-facing edge 175 of the base connection 156 facing the base-emitter junction 118 is shaped to progressively vary the length of the path through the base region 115 between the base connection and the base-emitter junction at successive points along the length of the base-emitter junction. The base current flowing through the base region between the junction-facing edge 175 of the base connection and the base side 117 of the base-emitter junction gives rise to a voltage drop across ate base region 115 that varies in proportion to the distance between the junction-facing edge 175 of the base connection and the base side 119 of the base-emitter junction. The junction-facing edge 175 of the base connection 156 is shaped so that, at all points along the length of the base-emitter junction 118, the resistance of the base region between the base connection and the base side 119 of the base-emitter junction is such that the sum of the voltage drops due to the base current flowing through the base metal 116 to the point and due to the base current flowing through the base region 115 is the same.

The layout of the bipolar power transistor 100 according to the invention is shown in FIG. 3A and a cross-sectional view is shown in FIG. 3B. An npn transistor will be described as an example. The structure of a pnp transistor is similar. To simplify the drawings, only one half of the transistor is shown. The transistor would normally have a structure that was symmetrical about the line 102.

The lightly-doped N-type region 104 provides the collector region 111 of the transistor 100. The collector region is isolated from other components of the integrated circuit by surrounding P-type regions (not shown). A highly-doped N-type region is formed in the collector region to provide the collector plug 161. Part of the oxide layer 163 covering the surface of the collector plug 161 is removed to provide the collector contact 165, which contacts the collector metal 112.

The base region 115 is formed by introducing a P-type impurity in the collector region 111 to provide a moderately-doped P-type region. The base region will be described in more detail below.

The emitter region 113 is formed by introducing an N-type impurity into the base region 115 to provide a highly-doped N-type region. Formation of the emitter region in the base region also forms the base-emitter junction 118. The emitter region has the structure shown in FIG. 3A to provide substantially the same voltage at the emitter side 117 of the base-emitter junction at all points along the length of the junction despite the ohmic drop in emitter voltage caused by the emitter current flowing in the emitter metal 114. Thus, the emitter region is divided into the junction zone 141 and the contact zone 143 interconnected by the interconnecting zones 145.

The junction zone 141 extends from the interconnection zones to the emitter side 117 of the base-emitter junction 118. The base-emitter junction is serrated to increase the length of the junction within the overall dimensions of the transistor.

Part of the oxide layer 163 covering parts of the contact zone 143 is selectively removed to provide the emitter contacts 167, which contact the emitter metal 114. Several emitter contacts are provided along the length of the contact zone.

The emitter metal 114 connects the contact zone 143 of the emitter region 113 to other elements (not shown) of the integrated circuit via the hypothetical emitter terminal 120. The width and thickness of the emitter metal are such that a substantial ohmic voltage drop occurs along the length of the emitter metal. The magnitude of the voltage drop increases progressively towards the remote end 122 of the emitter metal.

To correct the variation in the voltage at the emitter side of the base-emitter junction 118 caused by the progressive voltage drop along the length of the emitter metal 114, the junction zone 141 of the emitter region is connected to the contact zone 143 by the interconnecting zones 145. The interconnecting zones are surrounded by base material which has a lower conductivity than that of the emitter material. Segments of the emitter current therefore flow between the contact zone 143 and the junction zone 141 through the interconnecting zones 145. The width of each interconnecting zone is set to determine the resistance of the interconnecting zone such that the sum of the voltage drop due to the segment of the emitter current flowing through the interconnecting zone and voltage drop between the emitter terminal 120 and the part of the contact zone 143 adjacent the interconnecting zone is the same for each interconnecting zone. For a given voltage at the emitter terminal, this provides the same voltage at the emitter side 117 of the base-emitter junction 118 at all points along the length of the junction.

The width e2 of the interconnecting zone 169 adjacent the emitter terminal 120 is less than the width e1 of the interconnecting zone 171 adjacent the remote end 122 of the emitter metal. The ohmic drop in the emitter metal 114 between the emitter terminal 150 and the part of the emitter metal adjacent the ,emitter terminal is relatively small. Hence, the width of the interconnecting zone 169 is made small to provide a relatively large resistance, and hence a relatively large voltage drop across the interconnecting zone 169. The ohmic drop in the emitter metal 114 between the emitter terminal 150 and the end 122 of the emitter metal remote from the emitter terminal is relatively large. Hence, the width of the interconnecting zone 171 is made large to provide a relatively small resistance and hence a relatively small voltage drop across the interconnecting zone 171.

In the example shown in FIGS. 3A and 3B, the base connection 156 is formed by the base plug 154 and the base metal 116. The base plug 154 is formed by introducing additional P-type impurity into a selected part of the base region 115 to provide a highly-doped P-type region. The base plug includes the junction-facing edge 175 facing the base-emitter junction 118. Part of the oxide layer 163 covering the base plug is removed to provide the base contact 173, which allows the base metal 116 to contact the base plug 154 to complete the base connection 156. The base metal 116 connects the base plug 154 of the base region 115 to other elements (not shown) of the integrated circuit via the hypothetical base terminal 150.

Unlike in known power transistors, in which the junction-facing edge of the base connection are parallel to the base-emitter junction, in the power transistor 100 according to the invention, the junction-facing edge 175 of the base connection 156 is shaped to vary the distance between it and the base-emitter junction 118 along the length of the base-emitter junction. This variation in the distance between the junction-facing edge 175 of the base connection and the base-emitter junction 118 along the length of the base-emitter junction enables the voltage at the base side 119 of the base-emitter junction to be made the same at all points along the length of the base-emitter junction. This, together with an emitter structure that makes the voltage at the emitter side 117 of the base-emitter junction the same at all points along the length of the base-emitter junction, distributes the emitter current evenly along the length of the base-emitter junction independently of the emitter current and the current gain of the transistor.

The junction-facing edge 175 of the base connection 156, i.e., the junction-facing edge 175 of the base plug 154, is separated from the base side 119 of the base-emitter junction 118 by the junction zone 177 of the base region 115, which is of medium conductivity. Segments of the base current flowing from the junction-facing edge of the base plug to the base side 119 of the base-emitter junction through the resistance of the junction zone 177 cause an ohmic voltage drop between the base plug and the base side of the base-emitter junction. To provide the same voltage at the base side 119 of the base-emitter junction at all points along the length of the base-emitter junction, the voltage drop between the base terminal 150 and the base side of the base-emitter junction must be the same at all points along the length of the junction. For example, the voltage drop between the base terminal 150 and the point P1 on the base side 119 of the base-emitter junction 118 is given by the sum of the voltage drop ΔVM in the base metal 116 between the base terminal and the part of the base metal opposite the point P1 and the voltage drop ΔVS due to the segment of the base current flowing through the junction zone 177 between the base plug 154 and the point P1. The voltage drop ΔVS due to the segment of the base current flowing through the junction zone 177 between the base plug and the point P1 depends on the resistance of the part of the junction zone 177 between the base plug and the point P on the base-emitter junction. The resistance of the junction zone 177 between the base plug and the point P1 on the base-emitter junction depends on the distance b1 between the junction-facing edge 175 of the base plug and the point Pt on the base side 119 of the base-emitter junction.

By shaping the base connection 156 to vary the distance between the junction-facing edge 175 of the base connection and each point on the base-emitter junction 118, such as by making the distance b2 at the point P2 remote from the base terminal 150 less than the distance b1 at the point P1 near the base terminal, the voltage at the base side 119 of the base-emitter junction can be made the same all points along the length of the base-emitter junction despite the change in the voltage drop ΔVM along the length of the base metal 116.

Figure 4:
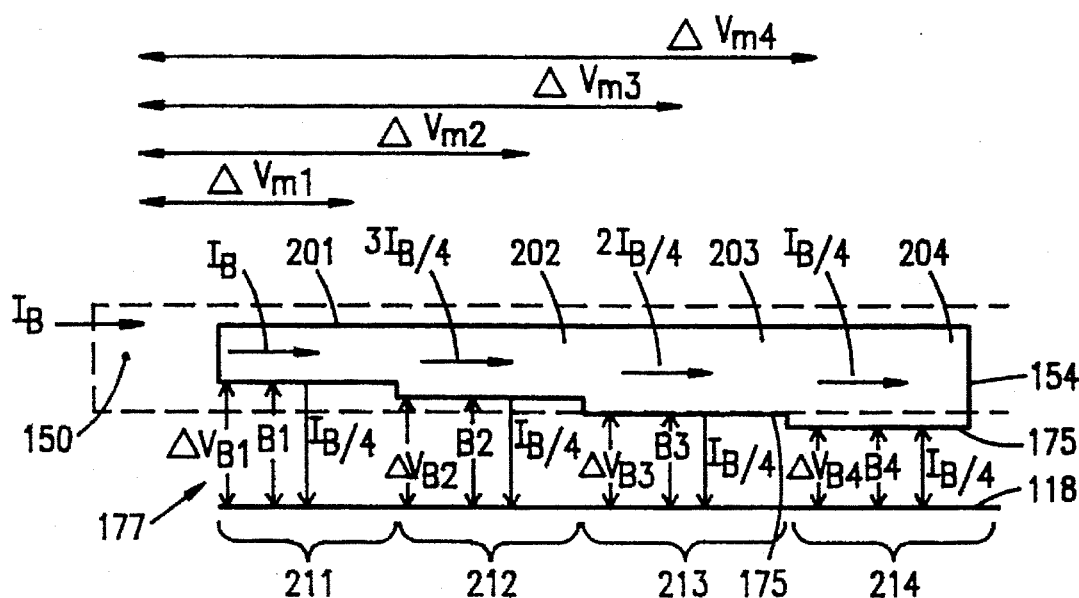
FIG. 4 illustrates the method by which the spacing between the junction-facing edge of the: base connection and the base-emitter junction is calculated in the power transistor according to the invention.

Due to the variation in the base current flowing through the base metal 116 at different points along the length of the base metal, the distance between the junction-facing edge 175 of the base connection and the base side 119 of the base-emitter junction 118 does not vary linearly with distance from the base terminal 150. An example of the method by which the shape of the junction-facing edge 175 of the base connection is calculated is illustrated in FIG. 4. The base connection 156, consisting of the base plug 154 and the base metal 116, is divided along its length into a number of equal-length elements, such as the elements 201, 202, 203, and 204. Only four elements are shown in FIG. 4 to simplify the drawing. In practice, a larger number of element e.g., 16 elements, would be used. The base-emitter junction 118 is divided into a number of elements corresponding to and opposite each of the elements of the base connection 156. The elements 211, 212, 213, and 214 are shown in FIG. 4.

In the following analysis, it is assumed that the resistance per unit length of the base metal 116 is constant along the length of the base metal, and that the resistance of each element of the base metal (corresponding to each element of the base connection 156) is R. It is also assumed that the flow of the base current IB between the each element of the base connection 156 and the corresponding element of the base-emitter junction 118 is divided equally between each element of the base connection.

First, the distance b4 between the fourth element 204 of the base connection and the fourth element 214 of the base-emitter junction 118 at the end of the base connection remote from the base terminal 150 is set to the minimum base geometry. From this, the resistance r4 of the junction zone 177 between the fourth element of the base connection and the base side of the fourth element of the base-emitter junction is given by:
$r4 = kb4$, where k is a constant.

The voltage drop ΔVB4 in the junction zone 177 between the fourth element 204 of the base connection and the base side of the fourth element 214 of the base-emitter junction is given by:

$$\Delta B4 = kb4 \times IB/4.$$

The voltage drop ΔVM4 in the base metal 116 between the base terminal 150 and the fourth element 204 of the base connection is given by:

$$\Delta VM4 = R(IB + 3IB/4 + 2IB/4 + IB/4) = 10IB\ R/4$$

Hence the voltage difference ΔV4 between the base terminal 150 and the base side of the fourth element 214 of the base-emitter junction is given by:

$$\Delta V4 = \Delta VB4 + \Delta VM4 = IB\ kb4/4 + 10IB\ R/4$$

The voltage differences ΔV3, ΔV2 and ΔV1 between the base terminal 150 and the base sides of the elements 213, 212, and 211 of the base-emitter junction respectively opposite the elements 203, 202, and 201 of the base connection must be made the same as ΔV4. As an example, calculation of the distance b2 between the second element 202 of the base connection and the second element 212 of the base-emitter junction 118 will be shown.

The voltage drop ΔM2 in the base connection between the base terminal 150 and the second element 202 of the base connection is given by:

$$\Delta VM2 = R(IB + 3IB/4) = 7IB\ R/4$$

Since the voltage difference ΔV2 between the base terminal 150 and the base side of the second element 212 of the base-emitter junction is given by:

$$\Delta V2 = \Delta B2 + \Delta VM2$$

and must be equal to ΔV4=IB kb4/4+10IB R/4, the voltage drop ΔB2 between the second element 202 of the base connection and the base side of the second element 212 of the base-emitter junction is given by:

$$\begin{aligned}\Delta VB2 &= \Delta V4 - \Delta VM2 \\ &= IB\ kb4/4 + 10IB\ R/4 - 7IB\ R/4 \\ &= IB\ kb4/4 + 3IB\ R/4\end{aligned}$$

From this, the resistance r2 of the junction zone between the second element 202 of the base connection and the base side of the second element 212 of the base-emitter junction is given by:

$$\begin{aligned}r2 &= \Delta VB2/IB/4 = 4\Delta VB2/IB \\ &= 4(IB\ kb4/4 + 3IB\ R/4)/IB \\ &= kb4 + 3R\end{aligned}$$

From this, the distance b2 is given by:

$$\begin{aligned}b2 &= r2/k \\ &= (kb4 + 3R)/k \\ &= b4 + 3R/k\end{aligned}$$

Similar steps are used to calculate the distance b1 of the first element 201 and the distance b3 of the third element 203 of the base connection from the first element 211 and the third element 213, respectively, of the base-emitter junction:

$$b1 = b4 + 6R/k$$

$$b3 = b4 + R/k$$

Actual distances for a sixteen element analysis, with a minimum distance of 6 μm are given in Table 1.

TABLE 1

| element | distance (μm) | element | distance (μm) |
|---|---|---|---|
| 1 | 6.0 | 9 | 6.4 |
| 2 | 6.0 | 10 | 6.5 |
| 3 | 6.0 | 11 | 6.7 |
| 4 | 6.1 | 12 | 6.8 |
| 5 | 6.1 | 13 | 6.9 |
| 6 | 6.2 | 14 | 7.1 |
| 7 | 6.2 | 15 | 7.2 |
| 8 | 6.3 | 16 | 7.4 |

Figure 5:
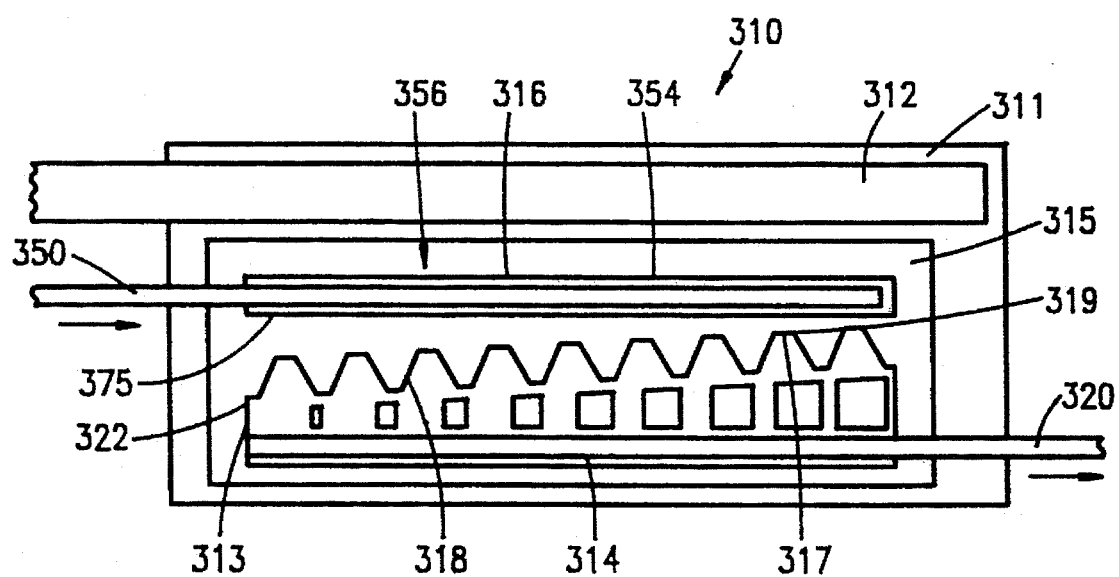
FIG. 5 shows the layout of a first alternative embodiment of the power transistor according to the invention.

FIG. 5 shows an alternative embodiment of the power transistor according to the invention in which the distance between the junction-facing edge 375 of the base connection 354 and the base-emitter junction 318 is varied by changing the shape of the emitter region 315. Elements in FIG. 5 corresponding to elements in FIG. 3A are indicated by the same reference numeral with 200 added. In the embodiment shown in FIG. 5, the junction-facing edge 375 of the base connection 356, i.e., the junction-facing edge of the base plug 354, is parallel to the edges of the base metal 316. To provide a substantially uniform voltage at the base side 319 of the base-emitter junction 318 along the length of the base-emitter junction, the emitter region 315 is shaped to shape the base-emitter junction 318 such that the distance between the base-emitter junction 318 and the junction-facing edge 375 of the base plug varies along the length of the base-emitter junction as shown.

As a further alternative, the variation in distance between the junction-facing edge 375 of the base connection 356 and the base-emitter junction 318 along the length of the base-emitter junction may also be provided by shaping both the base connection 356 and the emitter region 313 to make the distance between the junction-facing edge of the base connection and the base-emitter junction vary in the manner required along the length of the base-emitter junction.

Figure 6:
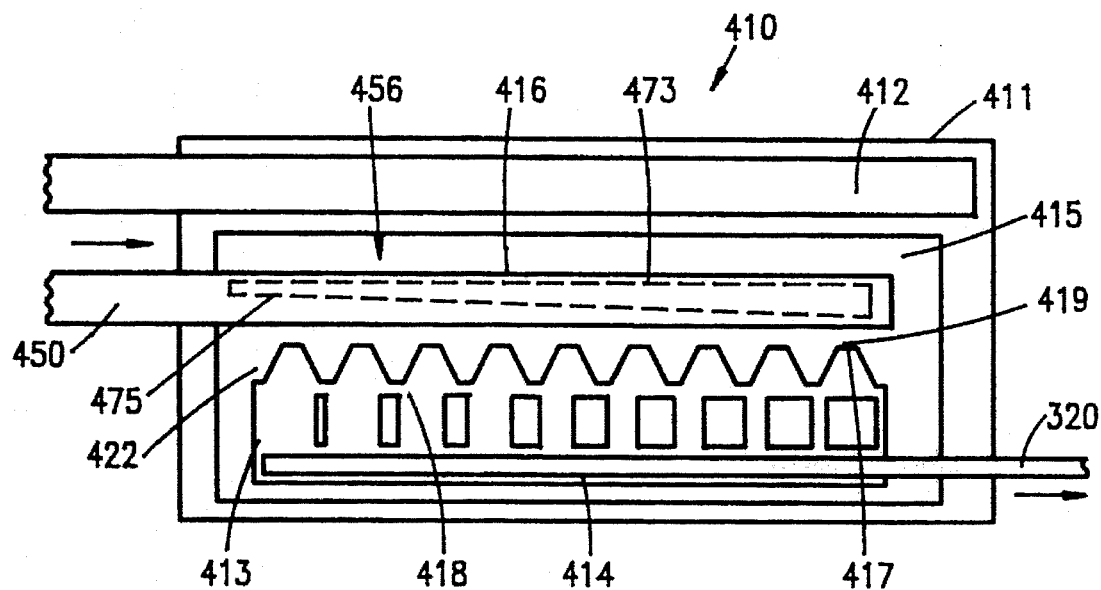
FIG. 6 shows the layout of a second alternative embodiment of the power transistor according to the invention.

FIG. 6 shows an embodiment similar to that shown in FIG. 3A. However, in the embodiment shown in FIG. 6, the base connection 456 lacks the base plug 154 shown in FIG. 3A. Elements in FIG. 6 corresponding to elements in FIG. 3A are indicated by the same reference numeral with 300 added. Part of the base metal 416 directly contacts the portion of the base region 415 defined by the base contact 473. The base contact 473 is shaped to vary the distance between its junction-facing edge 475 and the base-emitter junction 418 in accordance with the invention.

Figure 7:
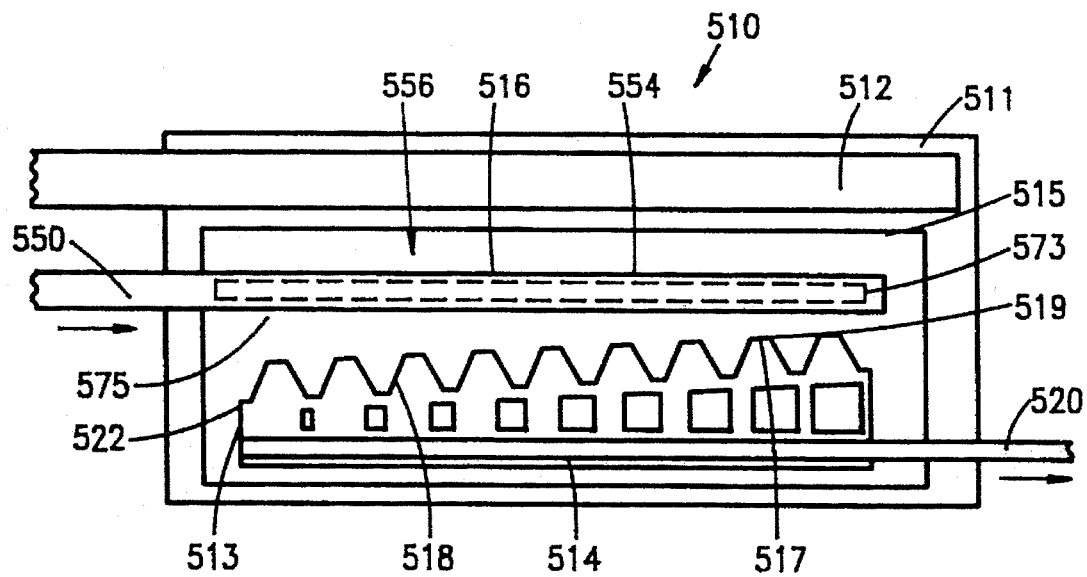
FIG. 7 shows the layout of a third alternative embodiment of the power transistor according to the invention.

FIG. 7 shows an embodiment similar to that shown in FIG. 5. However, in the embodiment shown in FIG. 7, the base connection lacks the base plug 354 shown at FIG. 5. Elements in FIG. 7 corresponding to elements in FIG. 5 are indicated by the same reference numeral with 200 added. Part of the base metal 516 directly contacts the portion of the base region 515 defined by the base contact 573. The base contact 573 is conventionally shaped, with its junction-facing edge 575 parallel to the edges of the base metal 516. The distance between the junction-facing edge 575 of the base contact 573 and the base-emitter junction 518 is varied along the length of the base-emitter junction in accordance with the invention by shaping the emitter region. 513, and hence, the base-emitter junction 518.

As a further alternative, both the junction-facing edge of the base contact and the emitter region may be shaped to vary the distance between the junction-facing edge of the base contact and the base-emitter junction along the length of the base-emitter junction in accordance with the invention.

Although illustrative embodiments of the invention have been described herein in detail, it is to be understood that the invention is not limited to the precise embodiments described, and that various modifications may be practiced within the scope of the invention defined by the appended claims.

I claim:

1. An integrated circuit power transistor, comprising:

an elongate, resistive, base region;

an elongate emitter region formed in part of the base region to provide a base-emitter junction, the base-emitter junction including a base side opposite an emitter side and having a length; and a strip-like base connection formed in part of the base region, the base connection extending from a base terminal towards a remote end, and including a junction-facing edge facing the base-emitter junction, the junction-facing edge being spaced from the base-emitter junction by a distance that decreases towards the remote end of the base connection to set the base side of the base-emitter junction to substantially the same voltage at all points along the length of the base-emitter junction despite an ohmic voltage drop in the base connection that increases towards the remote end of the base connection.

2. The integrated circuit power transistor of claim 1, wherein the base connection includes:

a strip-like base metal overlying part of the base region; and an elongate base plug formed in part of the base region under the base metal, the base plug including a junction-facing edge, facing the base-emitter junction, the junction-facing edge of the base plug providing the junction-facing edge of the base connection.

3. The integrated circuit power transistor of claim 2, wherein the emitter region is shaped to provide a base-emitter junction substantially parallel to the base metal.

4. The integrated circuit power transistor of claim 2, wherein the junction-facing edge of the base plug is substantially parallel to the base metal.

5. The integrated circuit power transistor of claim 1, wherein:

the power transistor additionally includes an oxide layer overlying the base region, the oxide layer having a through-hole formed therein;

the base connection includes an elongate base contact formed in the through-hole in the oxide layer, and a strip-like base metal overlying the base contact and part of the oxide layer; and the base contact includes a junction-facing edge, facing the base emitter junction, the junction-facing edge of the base contact providing the junction-facing edge of the base connection.

6. The integrated circuit power transistor of claim 5, wherein the emitter region is shaped to provide a base-emitter junction substantially parallel to the base metal.

7. The integrated circuit power transistor of claim 5, wherein the junction-facing edge of the base connection is substantially parallel to the base metal.

8. The integrated circuit power transistor of claim 1, additionally including:

a strip-like emitter metal formed on part of the emitter region, the emitter metal extending from an emitter terminal towards a remote end; and means, contacting the emitter metal, for setting the emitter side of the base-emitter junction to substantially the same voltage at all points along the length of the base-emitter junction despite an ohmic voltage drop in the emitter metal that increases towards the remote end of the emitter metal.

9. The integrated circuit power transistor of claim 8, wherein the base connection includes:

a strip-like base metal overlying part of the base region; and an elongate base plug formed in part of the base region, wherein the base region is formed under the elongate base plug, the base plug including a junction-facing edge facing the base-emitter junction, the junction-facing edge of the base plug providing the junction-facing edge of the base connection.

10. The integrated circuit power transistor of claim 9, wherein the emitter region is shaped to provide a base-emitter junction substantially parallel to the base metal.

11. The integrated circuit power transistor of claim 9, wherein the junction-facing edge of the base plug is substantially parallel to the base metal.

12. The integrated circuit power transistor of claim 8, wherein:
- the power transistor additionally includes an oxide layer overlying the base region, the oxide layer having a through-hole formed therein;
- the base connection includes
- an elongate base contact formed in the through-hole in the oxide layer, and
- a strip-like base metal overlying the base contact and part of the oxide layer; and
- the base contact includes a junction-facing edge facing the base-emitter junction, the junction-facing edge of the base contact providing the junction-facing edge of the base connection.

13. The integrated circuit power transistor of claim 12, wherein the emitter region is shaped to provide a base-emitter junction substantially parallel to the base metal.

14. The integrated circuit power transistor of claim 12, whereto the junction-facing edge of the base connection is substantially parallel to the base metal.

15. The integrated power transistor of claim 8, wherein the means for setting the emitter side of the base-emitter junction to substantially the same voltage at all points along the length of the base-emitter junction includes:
- an elongate contact zone contacting the emitter metal;
- an elongate junction zone adjacent the base-emitter junction; and
- plural interconnecting zones distributed along the contact zone and connecting the contact zone to the junction zone, the interconnecting zones having resistances that progressively decrease towards the remote end of the emitter metal.

16. An integrated circuit power transistor, comprising:
- an elongate, resistive, base region;
- an elongate emitter region formed in part of the base region to provide a base-emitter junction, the base-emitter junction including a base side opposite an emitter side and having a length;
- a strip-like base metal formed on part of the base region, the base metal extending from a base terminal towards a remote end;
- an elongate base plug formed in the base region under the base metal and contacting the base metal, the base plug including a junction-facing edge facing the base-emitter junction, the junction-facing edge being spaced from the base-emitter junction by a distance in at decreases towards the remote end of the base metal to set the base side of the base-emitter junction to substantially the same voltage at all points along the length of the base-emitter junction despite an ohmic voltage drop in the base metal that increases towards the remote end of the base metal;
- a strip-like emitter metal formed on part of the emitter region, and extending from an emitter terminal towards a remote end; and
- means, contacting the emitter metal, for setting the emitter side of the base-emitter junction to substantially the same voltage at all points along the length of the base-emitter junction despite an ohmic voltage drop in the emitter metal that increases towards the remote end of the emitter metal.

17. The integrated circuit power transistor of claim 16, wherein the emitter region is shaped to provide a base-emitter junction substantially parallel to the base metal.

18. The integrated circuit power transistor of claim 16, wherein the junction-facing edge of the base plug is substantially parallel to the base metal.

19. A method of distributing emitter current uniformly in a power transistor having an elongate base-emitter junction between an elongate emitter region formed in an elongate base region, the method comprising the steps of:
- forming a strip-like base connection in part of the base region, the base connection extending from a base terminal towards a remote end, and including a junction-facing edge facing the base-emitter junction and spaced therefrom by a distance; and
- shaping at least one of the junction-facing edge and the base-emitter junction to set the distance at plural points on the base-emitter junction such that the voltage drop between the base terminal and each of the plural points on the base-emitter junction is the same, the voltage drop between the base terminal and each of the plural points on the base-emitter junction being a sum of a first voltage drop and a second voltage drop, the first voltage drop being a voltage drop between the base terminal and a point on the base connection opposite the point on the base-emitter junction due to flow of base current through the base connection, the second voltage drop being a voltage drop between the point on the base connection and the point on the base-emitter junction due to flow of a segment of the base current through the base region.

20. The method of claim 19, additionally comprising the steps of:
- forming a strip-like emitter metal on part of the emitter region remote from the base-emitter junction, the emitter metal extending from an emitter terminal towards a remote end, substantially parallel to the base-emitter junction; and
- shaping the emitter region between the emitter metal and the base-emitter junction to provide differing resistances between the emitter metal and each of plural points on the: base-emitter junction such that the voltage drop between the emitter terminal and each of the plural points on the base-emitter junction is the same, the voltage drop between the emitter terminal and each of the plural points on the base-emitter junction being a sum of a first voltage drop and a second voltage drop, the first voltage drop being a voltage drop between the emitter terminal and a point on the emitter metal opposite the point on the base-emitter junction due to flow of emitter current through the emitter metal, the second voltage drop being a voltage drop between the point on the emitter metal and the point on the base-emitter junction due to flow of a segment of the emitter current through the resistance.

* * * * *

UNITED STATES PATENT AND TRADEMARK OFFICE
CERTIFICATE OF CORRECTION

PATENT NO. : 5,539,242
DATED : July 23, 1996
INVENTOR(S) : PERRY SCOTT LORENZ

It is certified that error appears in the above-indentified patent and that said Letters Patent is hereby corrected as shown below:

In Col. 13, line 23, delete "whereto" and replace with --wherein--.

In Col. 13, line 51, delete "in at" and replace with --that--.

In Col. 14, line 48, delete "the:" and replace with --the--.

Signed and Sealed this

Eighth Day of October, 1996

BRUCE LEHMAN

Attest:

Attesting Officer

Commissioner of Patents and Trademarks